(12) United States Patent
Lau et al.

(10) Patent No.: US 7,948,042 B2
(45) Date of Patent: May 24, 2011

(54) SUSPENDED STRUCTURES

(75) Inventors: Chun Ning Lau, Diamond Bar, CA (US); Gang Liu, Riverside, CA (US); Jairo Velasco, Jr., Riverside, CA (US)

(73) Assignee: The Regents of the University of California, Oakland, CA (US)

( * ) Notice: Subject to any disclaimer, the term of this patent is extended or adjusted under 35 U.S.C. 154(b) by 38 days.

(21) Appl. No.: 12/397,183

(22) Filed: Mar. 3, 2009

(65) Prior Publication Data

US 2009/0225592 A1 Sep. 10, 2009

Related U.S. Application Data

(60) Provisional application No. 61/033,222, filed on Mar. 3, 2008.

(51) Int. Cl.
*H01L 29/84* (2006.01)

(52) U.S. Cl. . 257/415; 257/417; 257/419; 257/E43.002; 257/E43.003; 257/E43.007; 257/E27.005; 257/E27.046; 257/E27.064

(58) Field of Classification Search .......... 257/204, 257/415, 417, 419, E43.002, E43.003, E43.007, 257/E27.005, E27.046, E27.064, E27.108, 257/E21.632; 438/50–53
See application file for complete search history.

(56) References Cited

U.S. PATENT DOCUMENTS

| | | | |
|---|---|---|---|
| 6,905,613 B2 | 6/2005 | Gutierrez et al. | |
| 2006/0237805 A1* | 10/2006 | Segal et al. | 257/414 |
| 2007/0158768 A1* | 7/2007 | Pilchowski et al. | 257/415 |
| 2008/0116491 A1* | 5/2008 | Lieber et al. | 257/211 |
| 2010/0214034 A1* | 8/2010 | Peng et al. | 331/154 |

OTHER PUBLICATIONS

F. Miao et al., "Phase-Coherent Transport in Graphene Quantum Billiards", *Science*, 2007, vol. 317, pp. 1530-1533.
G. Liu, J. Velasco, W. Bao, C.N. Lau, Fabrication of graphene p-n-p junctions with contactless top gates, *Phys. Lett.*, 2008, vol. 92, Issue 203103, pp. 1-3.
Huard et. al., "Transport Measurements Across a Tunable Potential Barrier in Graphene", *Phys. Rev. Lett.*, 2007, vol. 98, Issue 236803.
J.R. Williams, L. DiCarlo, C.M. Marcus, "Quantum Hall Effect in a Gate-Controlled p-n Junction of Graphene", *Science*, 2007, vol. 317, pp. 638.
Novoselov et al., Electric Field Effect in Atomically Thin Carbon Films, Science, Oct. 1, 2004, vol. 306, pp. 666-669.
Ozyilmaz et al., "Electric Field Effect in Atomically Thin Carbon Films", *Phys. Rev. Lett.*, 2007, vol. 99, pp. 166804.
Roman V. Gorbachev et al., "Conductance of p-n-p Graphene Structures with "Air Bridge" Top Gates", *Nano Letters*, Jun. 11, 2008, vol. 8, Issue 7, pp. 1995-1999.

* cited by examiner

*Primary Examiner* — Michelle Estrada
(74) *Attorney, Agent, or Firm* — Knobbe Martens Olson & Bear, LLP

(57) ABSTRACT

A multi-level lithography processes for the fabrication of suspended structures are presented. The process is based on the differential exposure and developing conditions of several a plurality of resist layers, without harsher processes, such as etching of sacrificial layers or the use of hardmasks. These manufacturing processes are readily suited for use with systems that are chemically and/or mechanically sensitive, such as graphene. Graphene p-n-p junctions with suspended top gates formed through these processes exhibit high mobility and control of local doping density and type. This fabrication technique may be further extended to fabricate other types of suspended structures, such as local current carrying wires for inducing local magnetic fields, a point contact for local injection of current, and moving parts in microelectromechanical devices.

9 Claims, 17 Drawing Sheets

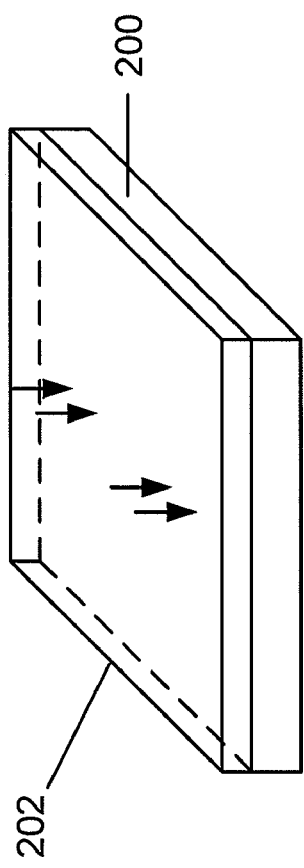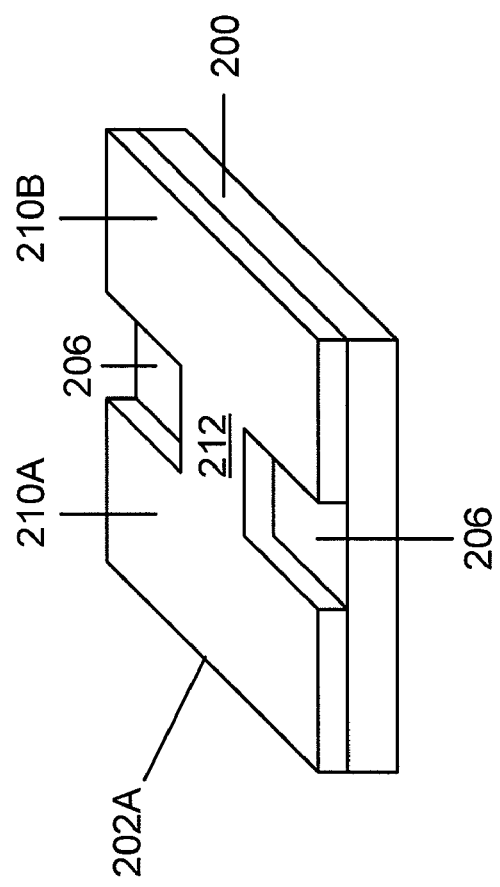

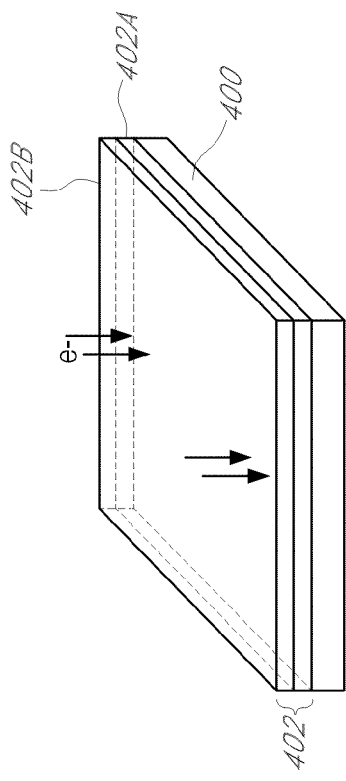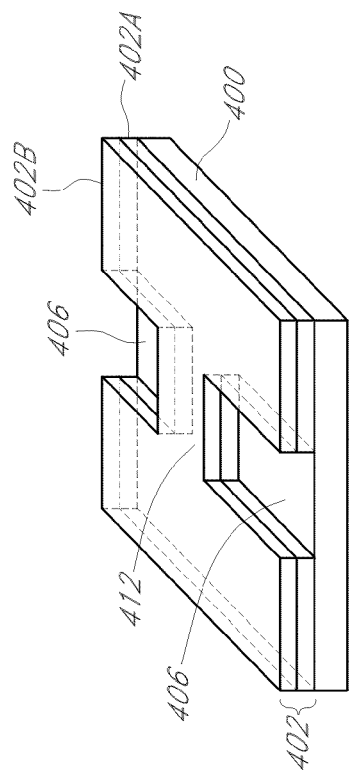

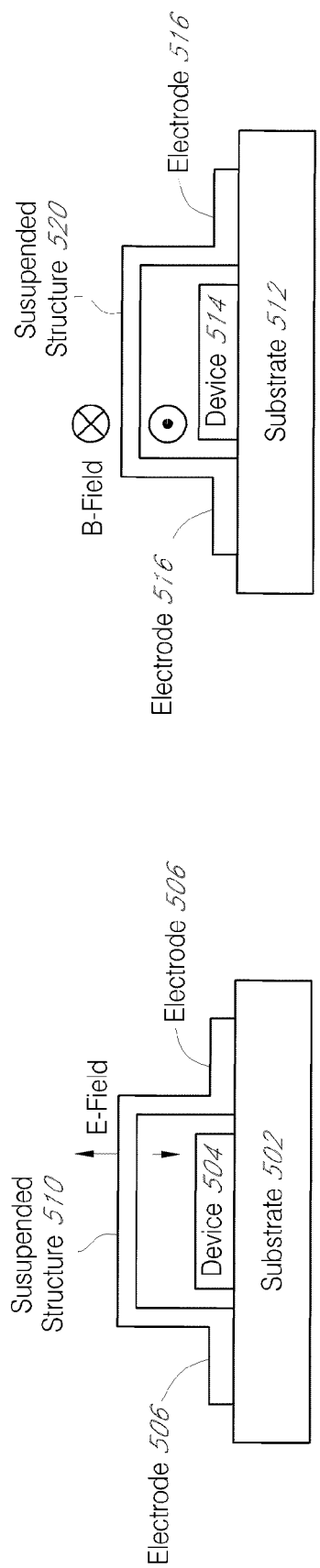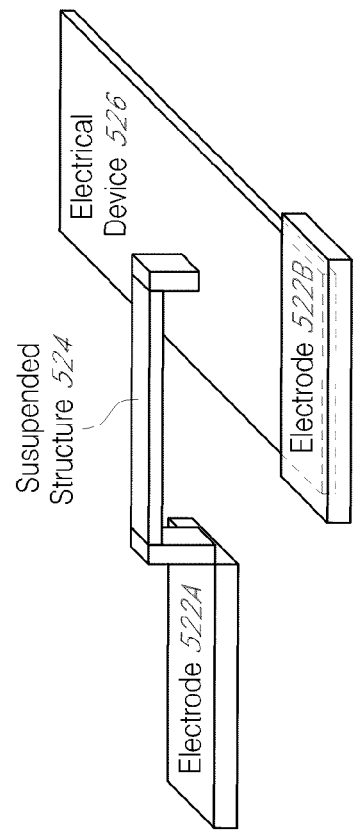
FIG. 5A
FIG. 5B
FIG. 5C

SUSPENDED STRUCTURES

CROSS-REFERENCE TO RELATED APPLICATIONS

This application claims the benefit of priority under 35 U.S.C. §119(e) of U.S. Provisional Application No. 61/033,222, filed on Mar. 3, 2008, entitled "CMOS COMPATIBLE SUSPENDED STRUCTURES", the entirety of which is hereby incorporated by reference and should be considered a part of this specification.

STATEMENT REGARDING FEDERALLY SPONSORED R&D

This invention was made with Government support under contract number 0748910 awarded by the National Science Foundation (NSF CAREER DMR) and contract number H94003-07-2-0703 awarded by the Office of Naval Research (ONR/DMEA). The Government has certain rights in this invention.

BACKGROUND

1. Field of the Invention

Embodiments of the present disclosure pertain to suspended structures and, in particular, to suspended structures fabricated by lithographic processes for use in microelectronic and micromechanical applications.

2. Description of the Related Art

Graphene, a single-layer, honeycomb lattice of carbon atoms, has recently emerged as a system of interest for fundamental studies in condensed-matter physics. Because of its unusual band structure, single-layer graphene is a zero-gap semiconductor with a linear energy dispersion relation. Under these circumstances, charges behave as substantially massless Dirac fermions and gives rise to novel phenomena, such as the half-integer quantum Hall effect. Technologically, graphene is a two-dimensional material with exceptional mobility, current-carrying capacity, and thermal conductivity, attracting significant attention to graphene as a promising post-silicon electronic material.

A remarkable electronic property of graphene is that both carrier type and density can be electrostatically controlled. Via the employment of a local gate and a global back gate, this feature allows in-situ creation and control of p-n or n-p-n junctions in graphene. These junctions have been demonstrated to induce band gaps in bi-layer graphene, partial equilibration of quantum Hall plateau, and have been predicted to give rise to Vaselago lensing, and Klein tunneling.

In most of the experiments to date, either organic or metal oxide layers have been used as the dielectric between graphene and local top gate. However, deposition of top gate dielectrics on a single atomic layer remains a delicate process, since impurities, defects and dopants may arise from deposition of the intervening layers.

SUMMARY

In an embodiment, a suspended structure is provided. The suspended structure comprises a substrate having a first surface, an electrically conductive structure suspended above the first surface of the substrate, a graphene layer positioned upon the first surface of the substrate and beneath the suspended electrically conductive structure, and a dielectric interposed between the electrically conductive suspended structure and the graphene layer.

In another embodiment, a method for the preparation of suspended structures is provided. The method comprises depositing a first resist layer upon a substrate, selectively removing at least a portion the first resist layer, such that a first and second region of the substrate are exposed and separated by an intervening region of the first resist layer, depositing a second resist layer upon the first resist layer and exposed regions of the substrate, selectively removing portions of the second resist layer to remove the second resist layer from the first and second regions of the substrate and the intervening region of the first resist layer, depositing a conductive material; and removing the first and second resist layers. After removal of the first and second resist layers, the conductive material remaining conforms to the shape of the first and second exposed regions of the substrate and the intervening region of the first resist layer.

In a further embodiment, a suspended structure system is provided. The suspended structure system comprises a plurality of base elements substantially in contact with a first surface of a substrate and a generally elongate bridge element interconnected with the base element. The at least one base element and elongate bridge elements are formed by depositing a first resist layer upon the first surface of the substrate, selectively removing at least a portion the first resist layer, such that a first and second region of the substrate are exposed and separated by an intervening region of the first resist layer, depositing a second resist layer upon the first resist layer and exposed regions of the substrate, selectively removing portions of the second resist layer to remove the second resist layer from the first and second regions of the substrate and the intervening region of the first resist layer, depositing a conductive material, and removing the first and second resist layers. The conductive material conforming to the shape of the first and second exposed regions comprises the plurality of base elements and the conductive material conforming to the shape of the intervening region of the first resist layer comprises the generally elongate bridge element.

In an additional embodiment, a magnetic storage device is provided. The magnetic storage device comprises the suspended structure system discussed above and a magnetic storage device interposed between the first surface of the substrate and the suspended structure. The magnetic storage device is capable of switching between a plurality of magnetic states in response to a magnetic field generated by the suspended structure system when a current is carried by the suspended structure system.

BRIEF DESCRIPTION OF THE DRAWINGS

FIGS. 2A-2F are schematic illustrations of patterning of various photoresist layers and conductive materials for the fabrication of suspended structures;

FIGS. 4A-4H are schematic illustrations of patterning of various photoresist layers and conductive materials for the fabrication of suspended structures;

FIGS. 5A-5C are embodiments of systems which may employ suspended structures formed from embodiments of the fabrication methods of embodiments of FIGS. 1 and 3;

DETAILED DESCRIPTION

Figure 1:
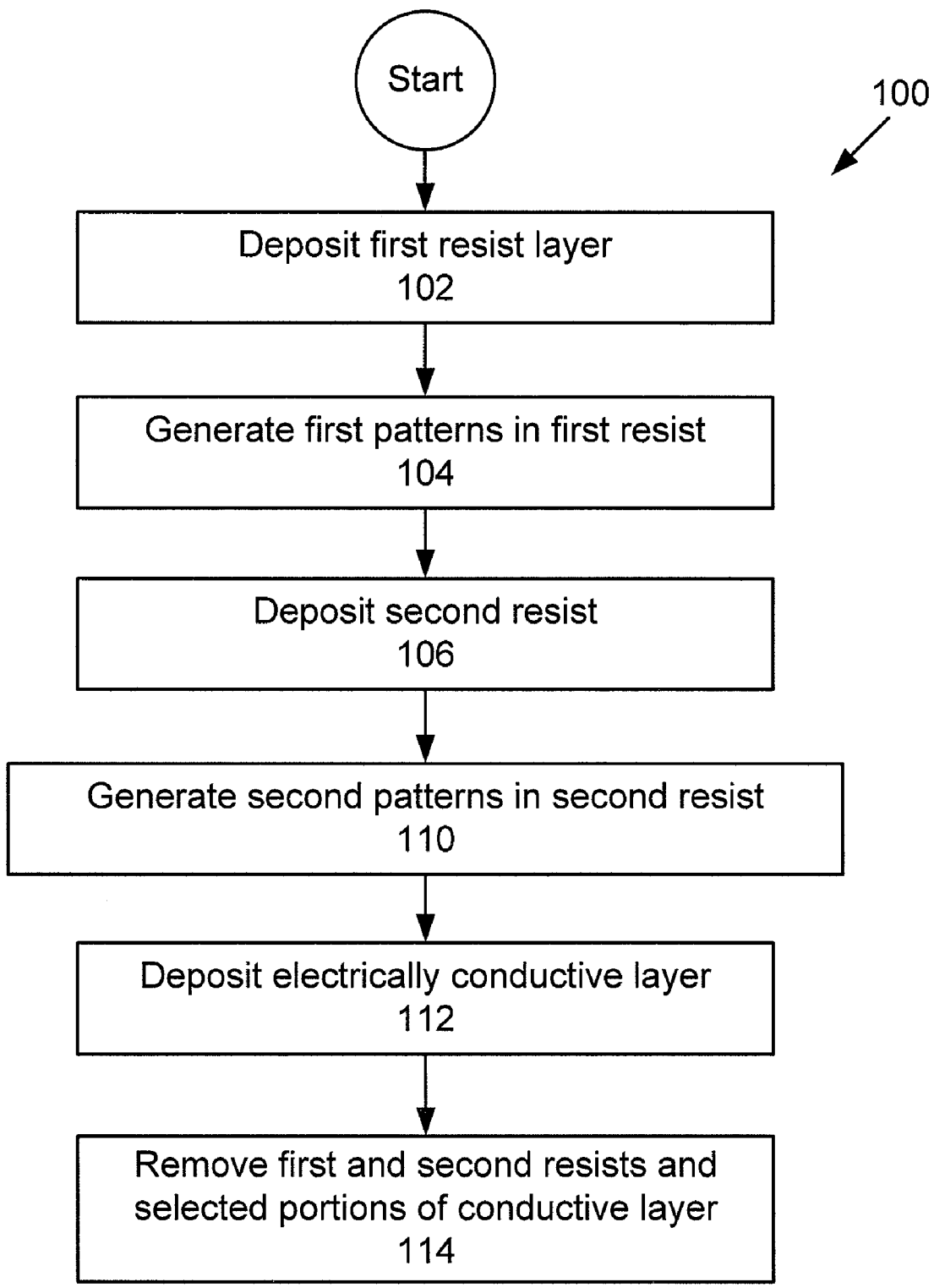
FIG. 1 is a flow diagram of one embodiment of a method for the fabrication of suspended structures.

Embodiments of the present disclosure present a multi-level lithography process for the fabrication of suspended structures which range from approximately sub-100 nm to about 10 μm in size. The process is based on the differential exposure and developing conditions of a plurality of photoresist layers, without the deposition of hard masks, such as Si, $SiO_2$, $Si_3N_4$, and may involve only one deposition of an electrically conductive material, such as metals and metal alloys.

Advantageously, this simple fabrication procedure for the production of suspended structures reduces manufacturing costs, eliminates unintentional damage to or doping of devices, and is compatible with large-scale CMOS technology. Furthermore, the process circumvents the use of intervening layers, such as dielectric materials or sacrificial layers, to be etched away in a later process. Thus, devices formed in this manner do not suffer from undesirable effects that arise from (a) deposition of the intervening layers, such as introduction of impurities, defects and dopants, or (b) etching of the sacrificial layers, which may also inadvertently etch other components.

In one example, embodiments of the photolithographic process may be employed in the fabrication of top gate structures which apply local electric fields. For example, suspended top gate structures are particularly advantageous in combination with graphene devices, as it has been observed that enhanced mobility may be achieved in suspended graphene p-n junctions. However, the fabrication of these devices is extremely difficult by previously developed techniques, as the direct deposition of local gate dielectrics may considerably stress or even collapse the thin graphene layers employed in these devices. Through use of the presently disclosed suspended structures, though, such damage may be substantially eliminated, facilitating the production of these suspended graphene devices.

As discussed in detail below, embodiments of the disclosed fabrication processes have been employed to fabricate suspended structures employed as contactless top gates in graphene p-n junctions. The suspended top gates may be positioned at distances of about 100 nm or less from the graphene and employ a vacuum insulated gap as a dielectric, substantially inhibiting pinholes and dielectric breakdown. These devices further exhibit relatively high mobility and local control of doping density and type.

Embodiments of this process may be further extended to the fabrication of other types of suspended structures without limit, and may find particular applicability in devices which are highly sensitive to process-induced damage, such as mechanically and/or chemically sensitive devices. Examples may include, but are not limited to, local current carrying wires for inducing local magnetic fields, point contacts for local injection of current. Embodiments of the process may be further extended to applications including the fabrication of sensors for detection of local magnetic fields and microelectromechanical (MEM) devices with moving parts, such as resonators. These and other advantages of the fabrication process are discussed below.

One embodiment of a process for the fabrication of suspended structures is illustrated in the flow diagram of FIG. 1 in conjunction with the process diagram of FIG. 2. It may be understood that the operations discussed may be performed in varying order than that illustrated and, furthermore, additional operations may be added or omitted, as necessary.

In an embodiment, the fabrication process comprises a plurality of photoresist and conductive material deposition and photolithographic/electron beam lithography patterning operations. Notably, these operations are performed without the deposition of hardmasks for use in patterning operations, including, but not limited to, silicon (Si), silicon dioxide ($SiO_2$), and silicon nitride ($Si_3N_4$). The goals of the deposition and photolithographic/electron beam lithography patterning are to deposit a resist layer that will act as mechanical support for deposited material for the suspended structure, and may be removed at the end of the fabrication and to create the windows for the electrical leads or "handles" that contact the suspended structure.

As illustrated in the embodiments of FIGS. 1 and 2, the process 100 begins in block 102 with deposition of a first resist layer 202 upon a substrate 200. The substrate 200 may comprise silicon (Si), silicon dioxide ($SiO_2$), silicon nitride, ($SiN_4$), compound III-V semiconductor materials (e.g., gallium arsenide, gallium nitride, indium phosphide), compound II-VI semiconductor materials, and combinations thereof. Such substrates 200 may be further doped with impurities, as necessary, to be either p-type or n-type.

The first resist layer 202 may comprise positive or negative photoresists. Examples of resists may include, but are not limited to, lift off resists (LOR), polymethylmethacrylate (PMMA), methyl methacrylate (MMA), polymethylgutarimide, Novolac, diazonaphthoquinone (DNQ), SU-08 (epoxy-based), and combinations thereof.

The thickness of the first resist layer 202 may be varied, as needed for the intended application. In certain embodiments, the thickness of the first resist layer 202 may be determined by the approximate distance desired between the substrate 200 and the suspended device to be formed. In certain embodiments, the thickness of the first resist layer 202 may range between 30 nm to 3 μm. In further embodiments, the thickness of the first resist layer 202 may range between about 300 to 600 nm. In additional embodiments, the thickness of the first resist layer 202 may range between about 100 to 300 nm.

In block 104, a first plurality of photolithography operations is performed to expose, develop, and etch first patterns in the first resist layer 202. Exposure may be performed using a variety of energy sources which may include, but are not limited to, electron beams, ultra-violet (UV) light, deep UV light, and X-rays. Following exposure, a developer appropriate to the first resist, such as methyl isobutyl ketone (MIBK), isopropyl alcohol, tetramethyl ammoniumhydroxide (e.g., MF319, Shipley), and the like, may be employed to substantially dissolve the exposed first resist.

In certain embodiments, the first resist layer 202 may be etched in patterns which enable later formation of electrical contacts and support structures for the suspended structure. For example, as illustrated in FIG. 2B, a plurality of etched portions 206 may be removed from the first resist layer 202 in forming the first patterned resist 202A. The etched portions or windows 206 may divide the patterned resist 202A into a first portion 210A and a second portion 210B and which are connected by a bridge portion 212. As discussed in greater detail below, deposition of conductive material within the space occupied by the windows 206 may form electrical contacts which also serve as a base for the suspended structure, while conductive material deposited on the bridge portion 212 forms the suspended structure itself.

Figure 2C:
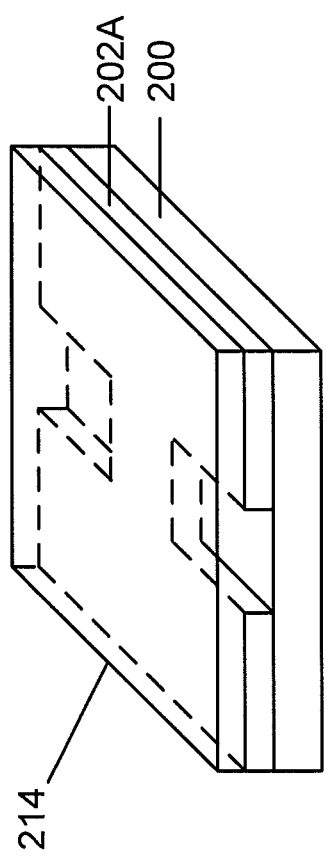

In block 106 a second resist layer 214 is deposited upon the first patterned layer 202A (FIG. 2C). In certain embodiments, the thickness of the second resist layer is about 500 to 900 nm. In further embodiments, the thickness of the second resist layer is about 200 to 300 nm. The second resist layer may be composed of resist materials that are different than the first resist layer 202 and may comprise positive or negative photoresists. Examples may include, but are not limited to, lift off resists (LOR), polymethylmethacrylate (PMMA), methyl methacrylate (MMA), polymethylgutarimide, Novolac, diazonaphthoquinone (DNQ), SU-08 (epoxy-based), and combinations thereof.

Figure 2D:
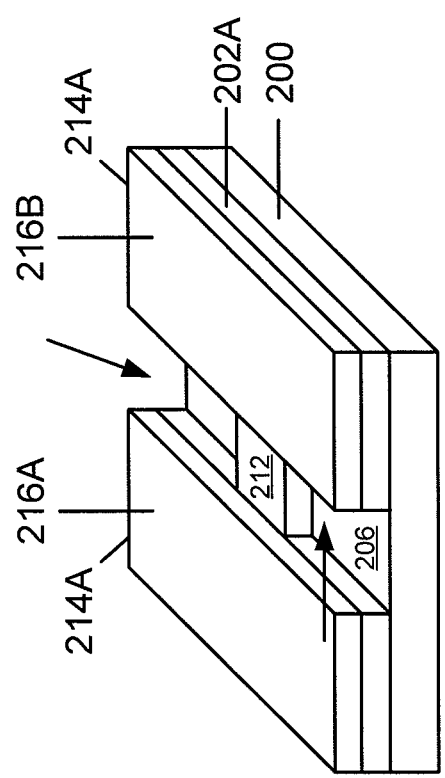
Figure 2E:
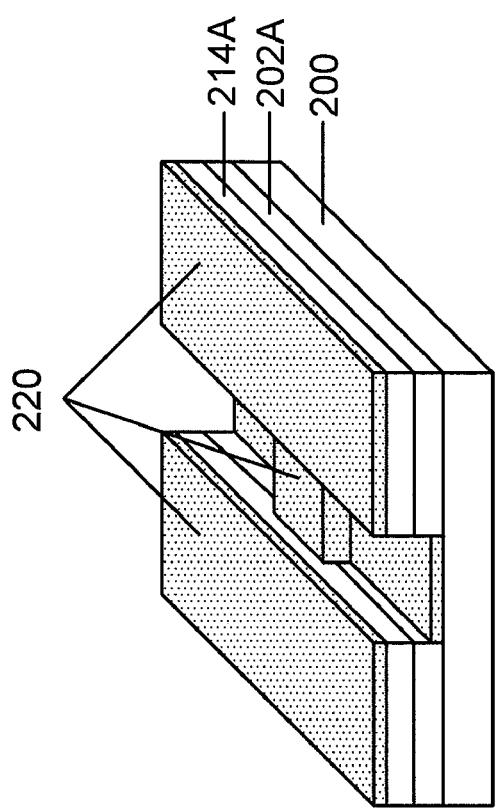
Figure 2F:
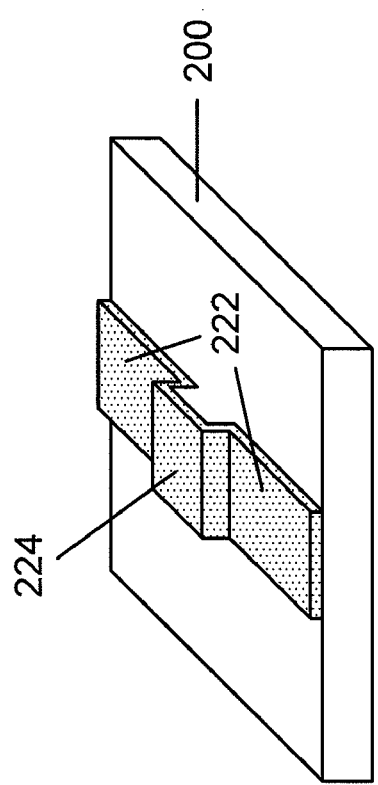

In block 110, a second plurality of photolithography operations is performed to expose, develop, and etch second patterns in the second resist layer 214. In certain embodiments, the second resist layer 214 may be etched to generate a patterned second resist layer 214 which further facilitates formation of electrical contacts and support structures for the suspended structure. For example, as illustrated in FIG. 2D, the second resist layer 214 may be patterned into first and second portions 216A and 216B which substantially cover the first and second portions 206A, 206B of the first patterned resist 202A, leaving the etched portions 206 and bridge portion 212 of the first patterned resist 202A uncovered by the patterned second resist layer 214A.

Upon completion of the second plurality of photolithography operations, an electrically conductive material is deposited upon the patterned first and second resist layers 202A, 214A in block 112. In certain embodiments, the electrically conductive material may comprise metals, metal alloys, and semiconductors. Examples, include, but are not limited to, titanium, aluminum, and alloys thereof.

In certain embodiments, the deposition of the conductive material may be performed in a plurality of operations at a plurality of angles with respect to the surface of the patterned resist layers 202A, 214A. For example, in one embodiment, evaporations may be performed at about 45° and −45° with respect to the substrate surface, (arrows, FIG. 2E), so as to deposit the conductive material onto the side-walls adjacent to the etched portions 206 of the first resist layer 202 and thereby enable contact between the suspended structure and the electrical leads, After deposition of the conductive material, the patterned resist layers 202A, 214A are removed, leaving the substrate 200 and conductive material 220, comprising electrical contacts 222 interconnected with suspended structure 224. For example, in one embodiment, the structure may be left in a solvent which is a stripper for the resist, such as N-methylpyrrolidone (NMP), and the like. After the patterned resist layers 202A, 214A are removed, the suspended structure 224 and electrical contacts 222 may be further rinsed in solvents such as alcohols and dried in an inert gas, such as nitrogen.

Figure 3:
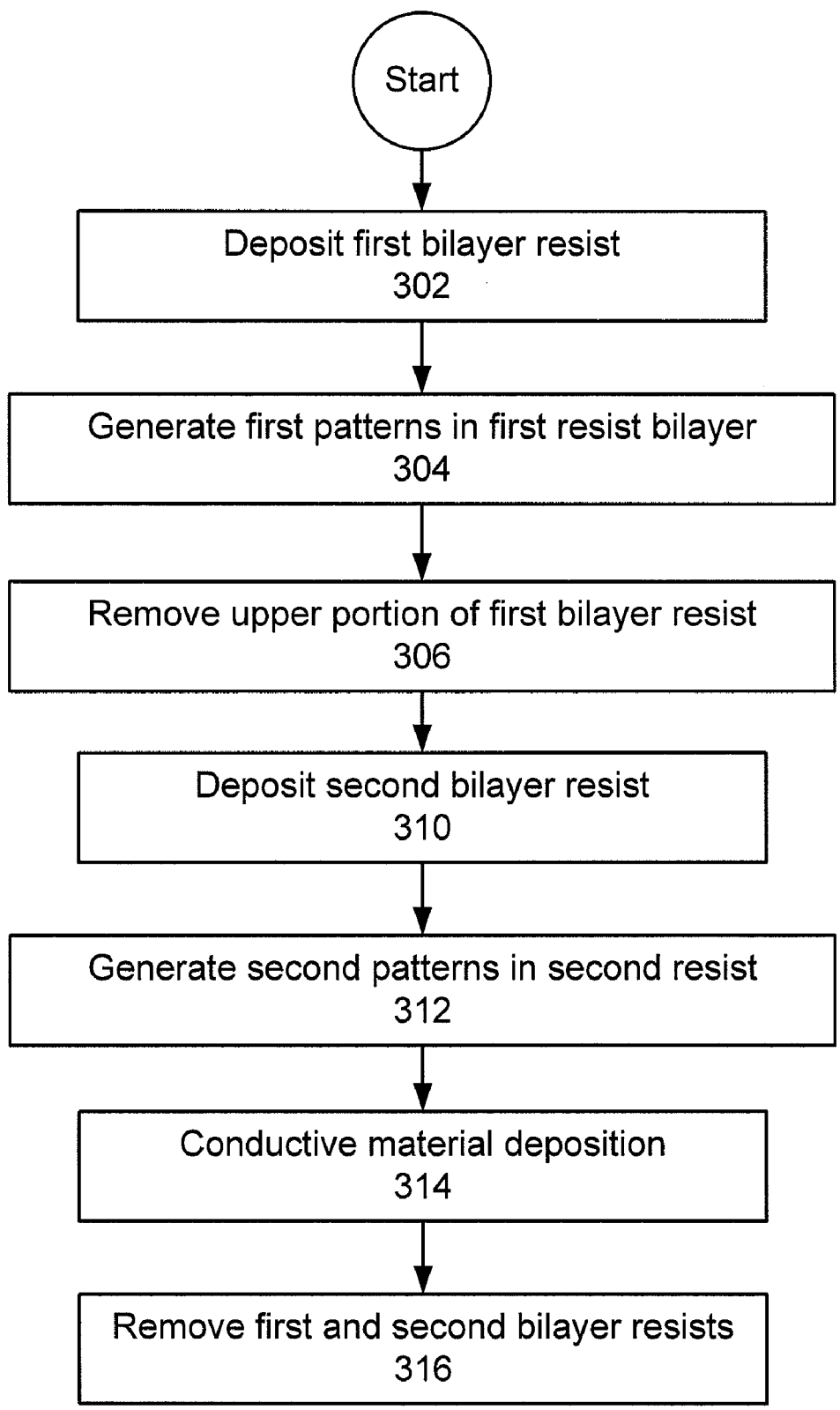
FIG. 3 is a flow diagram of another embodiment of a method for the fabrication of suspended structures.

FIGS. 3 and 4 illustrate a flow diagram and schematic illustrations of an alternative embodiment of a method 300 for the fabrication of suspended structures in which resist bilayers are employed. In certain embodiments, the use of resist bilayers may facilitate metal liftoff.

The method 300 begins in block 302 with the deposition of a first bilayer 402 resist upon a substrate 400. The portion of the first bilayer resist adjacent to the substrate 500 will be referred to herein as the first layer 402A of the first bilayer resist 402, while the portion of the first bilayer resist adjacent to the first layer 402A and the free surface will be referred to as the second layer 402B of the first bilayer resist 402. In certain embodiments, the total thickness of the first bilayer resist 402 is about 300 to 600 nm. In further embodiments, the thickness of the first layer 402A is about 30 nm to 3 µm. In other embodiments, the thickness of the first layer 402A is about 30 nm to 300 nm and the thickness of the second layer 402B is about 200 m to 300 nm.

Embodiments of the first bilayer resist may include, but are not limited to, lift off resists (LOR), methylmethacrylate (MMA), polymethylmethacrylate (PMMA), and S185 photoresist. In one embodiment, the first bilayer resist may comprise an LOR/PMMA first bilayer 402. For example, the LOR and PMMA may comprise the first and second layers 402A, 402B of the first bilayer 402, respectively. In further embodiments, the substrate 400 may comprise, in doped or undoped configurations, silicon (Si), silicon dioxide ($SiO_2$), silicon nitride ($SiN_4$), and combinations thereof. In further embodiments, the substrate 400 may comprise compound III-V semiconductor materials (e.g., gallium arsenide, gallium nitride, indium phosphide), compound II-VI semiconductor materials, and combinations thereof. Such substrates 200 may be further doped with impurities, as necessary, to be either p-type or n-type. In one embodiment, the substrate may comprise degenerately doped $Si/SiO_2$.

After deposition of the first resist bilayer 402, the method 300 continues in block 304, where a first plurality of photolithography operations is performed in order to pattern the first resist bilayer 402. Exposure may be performed using a variety of energy sources which may include, but are not limited to, electron beams, ultra-violet (UV) light, deep UV light, and X-rays. Following exposure, the first resist bilayer 402 may be developed twice in order to differentially etch the first and second of the resist bilayer in the pattern (FIG. 4B). For example, the resist bilayer 402 may be developed in a first developer to substantially dissolve exposed portions of the second layer 402B. Subsequently, the first resist bilayer 402, may be developed in a second developer to dissolve portions of the first resist layer 402A which are exposed through the second resist layer 402B.

Figure 4C:
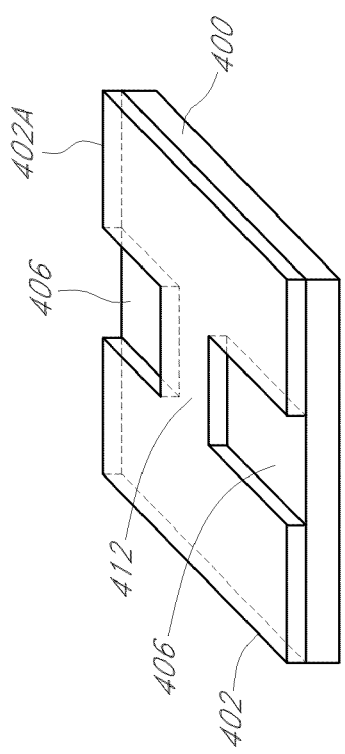

After development, the layer 402B of the first bilayer resist 402 may be removed in block 306, leaving the first layer 402A substantially intact. The removal of the second layer 402B may be warranted under circumstances where it is desired that the first layer 402A define the height of the suspended structure from the substrate. To achieve removal of the second layer 402B from the first bilayer resist 402, for example, an appropriate solvent may be used to lift off the second layer 402B while leaving the first layer 402A substantially intact (FIG. 4C). As discussed above in an embodiment, LOR may be used as the first layer 402 and PMMA may be used as the second layer 402B. As LOR is inert in acetone, treatment of the first bilayer resist 402 with acetone may facilitate removal of the PMMA layer while retaining the LOR layer.

As illustrated in FIG. 4C, in this manner, windows 406 may be etched into the first resist bilayer 402. These windows 406, as discussed above, may serve as locations for electrical contacts of the suspended structure, while at least a portion of the first bilayer resist 402 may comprise a bridge portion 412 which may serve as a template and support for the suspended structure during fabrication.

In block 310, a second plurality of photolithography operations are performed, where a second bilayer resist 414 is deposited upon the remainder of the first bilayer resist 402 (e.g., the first layer 402A). The second bilayer resist comprises two layers, which will be referred to as third and fourth layers 414A and 414B to avoid confusion with the first and second layers 402A, 402B of the first bilayer 402. In certain embodiments, the total thickness of the second bilayer resist 414 is about 500 to 900 nm. In further embodiments, the thickness of the third layer 414A is about 200 to 300 nm and the thickness of the fourth layer 414B is about 200 to 300 nm.

Figure 4D:
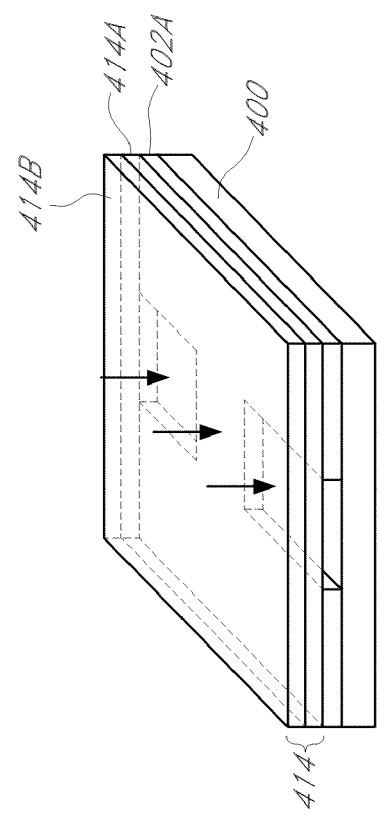
Figure 4E:
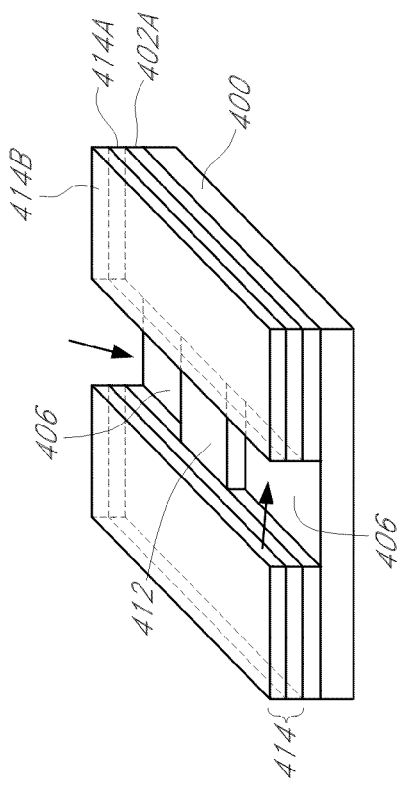

After deposition of the second resist bilayer 414, the method 300 continues in block 310, where a second plurality of photolithography operations are performed in order to pattern the second resist bilayer 414. Electron beam exposure providing patterns for both the suspended structure and electrical leads (FIG. 4D). For example, such patterns may be configured such that, after development in appropriate developers, the portions of the second resist layer 414 which cover the windows 406 and bridge 412 may be removed. In this manner, windows in second resist bilayer 414 for the support structure for the suspended structure and windows in all three resist layers for the leads are achieved (FIG. 4E). The third resist layer 414B, in certain embodiments, may be used for creating slight undercuts so as to facilitate a clean final lift-off.

Figure 4F:
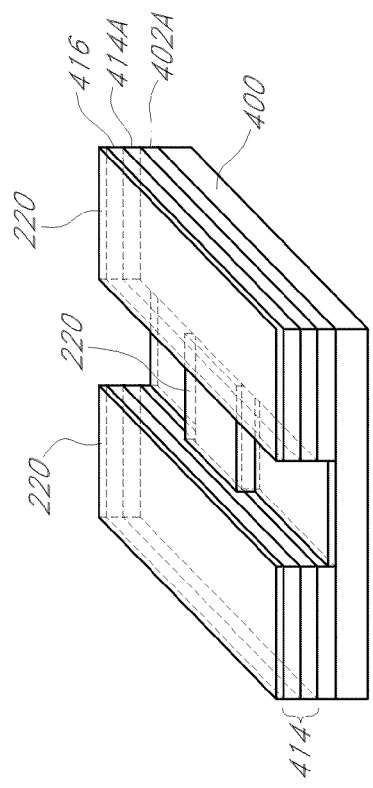
Figure 4H:
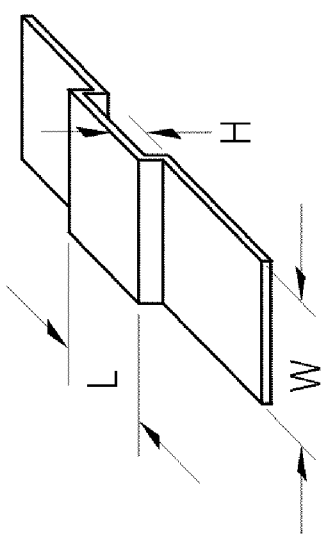
Figure 4G:
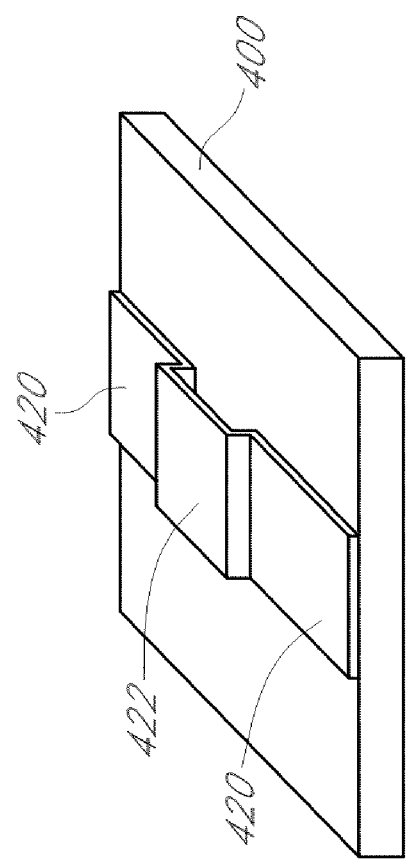

Upon completion of the second plurality of photolithography operations, conductive material 416 is deposited upon the remainder of the first and second resist bilayers 402, 414 in block 314. In certain embodiments, the conductive material deposition may be performed in a plurality of operations at a plurality of angles with respect to the surface of the resist bilayers. Examples of the deposited conductive material may include, but are not limited to semiconductors, titanium, aluminum, and alloys thereof. For example, in one embodiment, so as to deposit metals onto the side-walls of the windows and ensure contact between the suspended structure and the electrical leads, two separate evaporations may be performed at about 45° and −45° with respect to the substrate surface, (FIG. 4F). After metal deposition, the bilayers are removed, leaving the substrate 400 and conductive material 416, in the form of electrical contacts 420 and suspended structure 422.

Advantageously, embodiments of the fabrication methods 100, 300 for the fabrication of suspended structures takes advantage of the different exposure, developing, and lift-off properties of different resists, allowing substantially precise control over the deposition process. For example, by controlling the conditions of the first and second plurality of photolithography operations, it is possible to fabricate suspended structures, such as air bridges, with considerable variation in dimensions, including span (l), width (w), and height above the substrate (h).

In one embodiment, the height of the suspended structure above the substrate is largely determined by the thickness and planar extent of the first layer of the first bilayer resist. For example, the height may range between about 50 nm to 3 μm and the length may range between about 0.1 to 25 μm. In other embodiments, thinner resists may be used for the first photolithography operation in order to reduce the distance from the substrate to the bridge. In alternative embodiments, the distance from the substrate to the bridge may be reduced to roughly about 20 nm or below, yielding better spatial resolution.

The material selected for the suspended structure may be further selected to influence its geometry. For example, materials with higher ratios of elastic modulus to density may be able to form longer spans without substantial sagging. In one embodiment, without the use of special equipment such as a critical point dryer, it may possible to create air bridges from titanium which are up to approximately 1 μm to 7 μm without substantial sagging. For example, in one embodiment, the length of the suspended structure is approximately 7 μm.

In certain alternative embodiments, the suspended structure is may be configured so as to possess a selected amount of bottom beam deflection at about the midpoint of its length. For example, when the suspended structure is employed in applications such as gates and p-n junctions, the midpoint deflection is selected to be approximately zero. In alternative embodiments, the deflection is may be selected such that the unsupported length of the suspended structure does not contact the underlying substrate. In further embodiments, the deflection may be selected such that a gradient in electric or magnetic fields as a function of position may be achieved with the suspended structure.

Furthermore, the process may be performed without special equipment, such as critical point dryers or vapor phase etching systems. In one aspect, by employing angle evaporation, the connection between the side walls and span of the suspended structure are strengthened. The use of bilayer resists, which facilitates liftoff, also strengthens this connection. As a result, the need for specialty equipment, which is typically employed for suspension of the span, may be reduced or eliminated.

Additionally, deposition of the conductive material is nearly the last operation performed in the fabrication, complications arising from multiple deposition operations between photolithography operations are substantially avoided. Such complications may include oxidation/etching of metallic gate structures and formation of resist residues which prevent good electrical contacts between the electrical contacts and the suspended structure.

In alternative embodiments, the suspended structure may be configured so as to possess a selected amount of deflection at about the midpoint of its length. For example, when the suspended structure is employed in applications such as gates and p-n junctions, the midpoint deflection is selected to be approximately zero. In alternative embodiments, the deflection may be selected such that the unsupported length of the suspended structure does not contact the underlying substrate. In further embodiments, the deflection may be selected such that a gradient in electric or magnetic fields as a function of position may be achieved with the suspended structure.

Embodiments of the above discussed fabrication methods 100, 300 may be employed in a wide variety of application (FIGS. 5A-5C). Examples, include, but are not limited to, top gate structures which apply local electric fields (FIG. 5A), local current carrying wires for inducing local magnetic fields (FIG. 5B), and point contacts for local injection of current (FIG. 5C).

Figure 6:
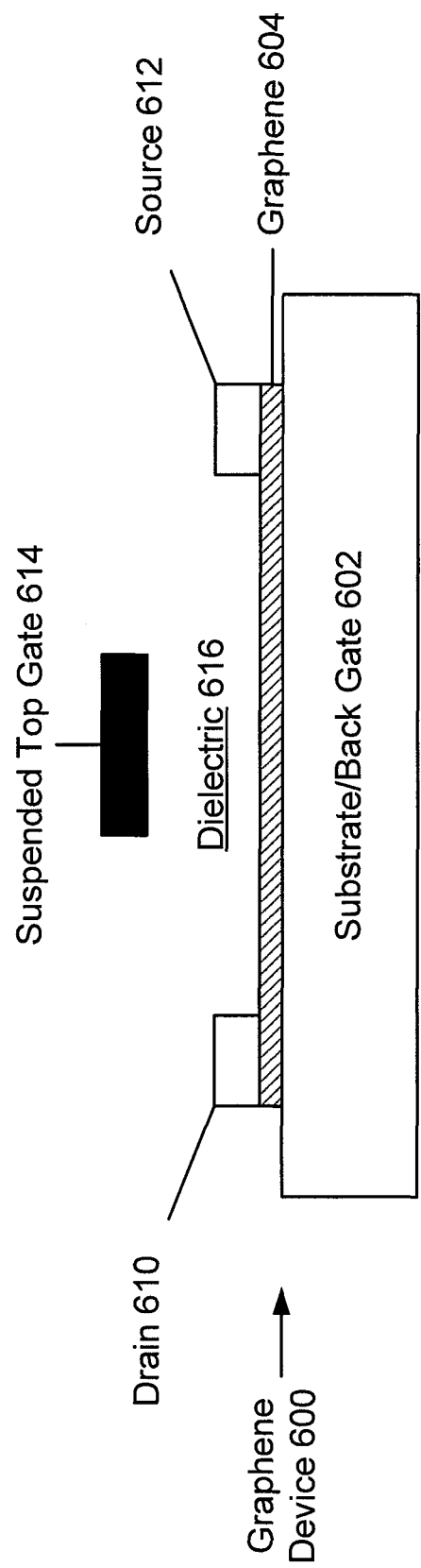
FIG. 6 is a schematic illustration of an embodiment of a graphene device employing a suspended top gate structure.

One embodiment of a graphene device 600 incorporating a suspended structure as a top gate structure 614 is illustrated in FIG. 6. The graphene device 600 may comprise a substrate 602 upon which a thin layer of graphene 604 is placed, as well as source and drain 610, 612 in electrical communication with the graphene 604. A dielectric 616 may be further interposed between the graphene and suspended top gate 614. In certain embodiments, the substrate may comprise doped silicon with a silicon dioxide layer upon the silicon, adjacent the graphene layer 606. The dielectric may comprise air or vacuum. The graphene layer 606 may comprise single layers, bilayers, or multiple layers of graphene. The graphene layer 606 may further range in thickness between about 0.1 to 5 nm, for example, less than about 50 nm. Source and drain electrodes may be electrically coupled to the graphene film. The top gate structure 614 may be positioned such that the graphene layer 604 is approximately beneath. Additional details on the formation of the graphene device 600 may be found in F. Miao, et al., "Phase Coherent Transport in Graphene Quantum Billiards," *Science*, 317, 150-1533 (2007), the entirety of which is hereby incorporated by reference.

Beneficially, since only resists and developers are involved in the fabrication of the top suspended top gate structure, the process is much gentler than alternative procedures, such as acid etching of $SiO_2$ sacrificial layers. Furthermore, deposition of the suspended top gate and its electrical leads may be finished in one vacuum cycle. Thus, this process also minimizes damaging the atomic layer or introducing undesirable impurities. As a result, any structural damage introduced into the graphene layer 606 during fabrication of the suspended top gate 614 may be minimal, and any dopants that may be inadvertently introduced can be removed with relative ease through techniques such as annealing.

By employing a vacuum insulated gap between the suspended top gate 614 and the graphene device 600, a robust dielectric is provided that is resistant to the development of pinholes and leakage current, improving performance of the graphene device 600.

Furthermore, by modifying the geometry and/or materials of the suspended structures, a broad variety of configurations may be achieved. In one example, the length of the suspended structure substantially limits the width of the graphene strip that may be employed in conjunction with the suspended top gate structure. Furthermore, the width has a substantial influence on the gate efficiency. In additional embodiments, the width of the top gate may be controlled by design parameters, such as the line dosage during e-beam lithography.

In other embodiments, suspended structures may be employed for use as local current carrying wires for inducing local magnetic fields (FIG. 5B). Such magnetic fields may be employed in conjunction with magnetic media configured for data storage. These media are designed such that highly localized magnetic fields may cause magnetic domains to switch from one magnetic state to another upon application of a selected magnetic field. A benefit of such a configuration is elimination of the need for a read/write head which moves over the surface of a magnetic media. Through the use of high-density array of suspended structures over a high density magnetic storage media, a high capacity magnetic storage device may be achieved.

The magnetic field generated by such a suspended structure may be varied, depending upon the geometry of the suspended structure and the current which it carries. In one embodiment, for a suspended structure at a height of about 10 nm from the substrate carrying an approximately 10 mA current, the magnetic field induced may range between about 100-1000 Gauss. In further embodiments, the magnetic field may be further influenced by deflection of the span of the suspended structure.

FIG. 5C illustrates a third embodiment of a suspended structure 524 as a point contact for local injection of current (FIG. 5C). In certain embodiments, a first electrode 522A may be in electrical communication with the suspended structure 524 and a second electrode 522B may be in electrical communication with an electrical device 526. In certain embodiment, the electrical device 526 may comprise a graphene thin film. The suspended structure 524 may further span only a portion of the width of the graphene thin film and touch the graphene thin film at a selected location. A configuration such as that illustrated in FIG. 5C may be beneficial for the detection of local current within selected locations about the point of contact between the suspended structure 524 and graphene thin film. An example of such a location may include, but is not limited to, about the center of the width and/or length of the graphene thin film.

EXAMPLES

To demonstrate application of the fabrication technique, a suspended top gate structure formed in accordance with the embodiments discussed above was applied onto a graphene p-n-p junction device. In particular, these devices demonstrate high mobility and local control of doping density and type. These examples are discussed for illustrative purposes and should not be construed to limit the scope of the disclosed embodiments.

Figure 7:
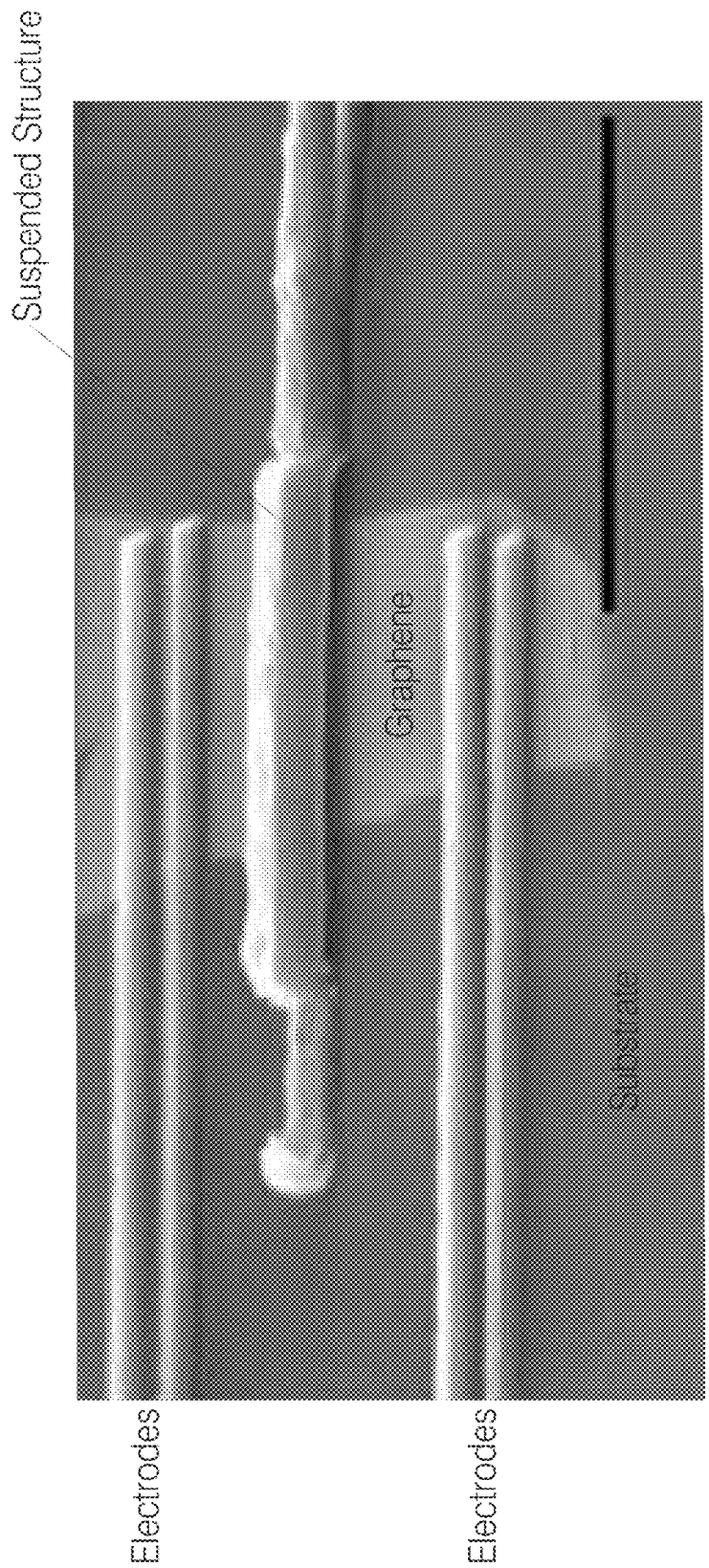
FIG. 7 is an SEM micrograph of an embodiment of a graphene device employing a suspended top gate structure.

In one embodiment, a single layer graphene device with source-drain electrodes (about 5 nm chromium and about 80 nm of gold) was fabricated according to F. Miao, S. Wijeratne, Y. Zhang, U. Coskun, W. Bao, and C. N. Lau, *Science* 317, 1530 (2007). A completed p-n-p device is illustrated in FIG. 7. The source-drain separation of the device, where the source and drain are the inner pair of electrodes, is about 3.5 µm. The suspended top gate covers a span of about 0.5 µm and is suspended about 100 µm above the substrate.

Figure 8A:
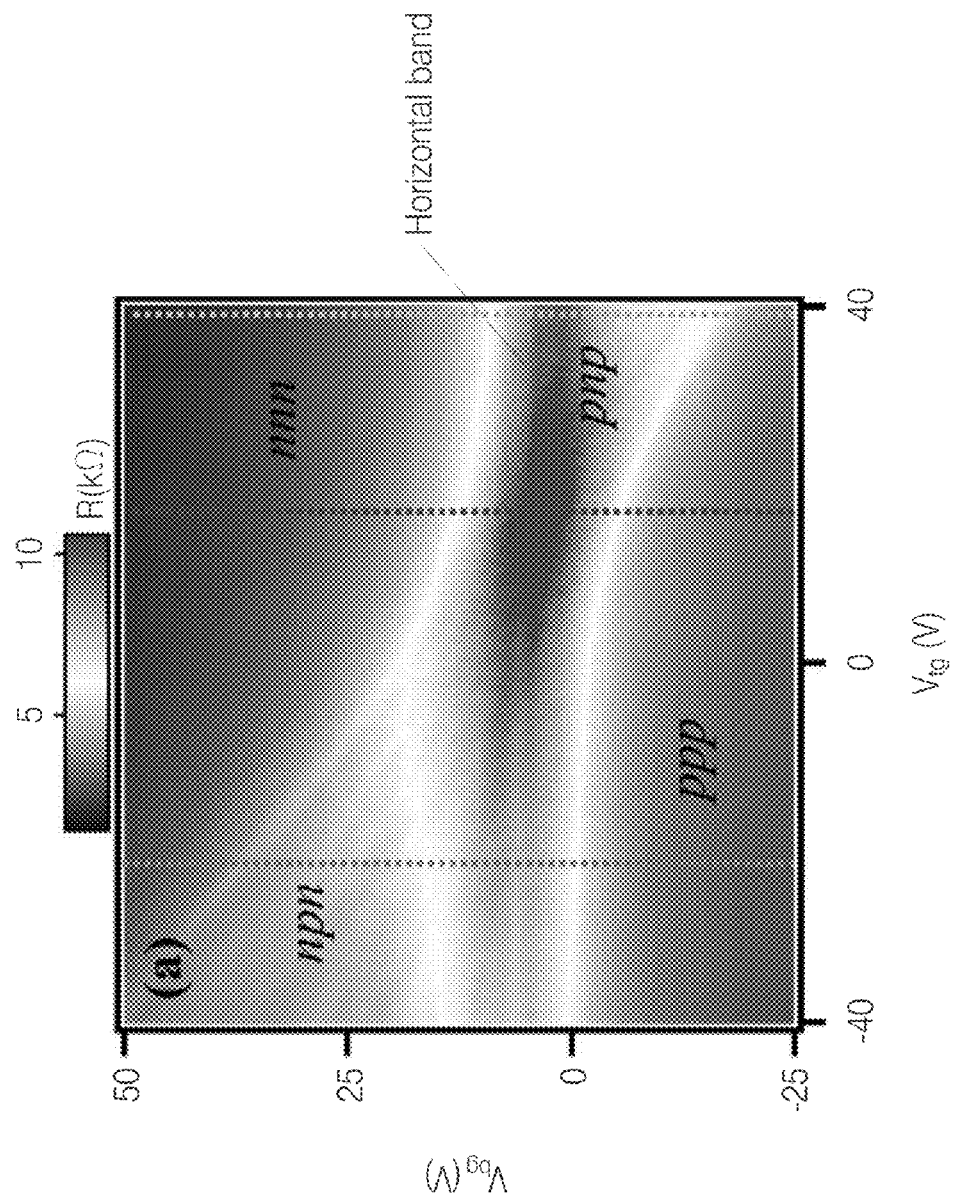
FIG. 8A is a plot of differential resistance for an embodiment of a graphene device employing a suspended top gate structure as a function of top gate voltage ($V_{tg}$) and bottom gate voltage ($V_{bg}$). Doping combinations for different regions are labeled.

In order to evaluate the performance of the device, the differential resistance was measured at about 260 mK using standard lock-in techniques. The results of these measurements are illustrated in FIG. 8A, as a function of back gate voltage ($V_{bg}$), vertical axis, and top gate voltage ($V_{tg}$), horizontal axis. The most visible feature of this differential resistance plot is a broad, horizontal band at about $V_{bg}$ of about 14 V, corresponding to about the Dirac point of the entire graphene sheet between the source and drain electrodes. The device mobility is estimated to be about 8500 cm$^2$/Vs. Another notable feature of the differential resistance measurements of FIG. 8A is the substantially diagonal white band, indicating the Dirac point for the top-gated region.

Figure 8B:
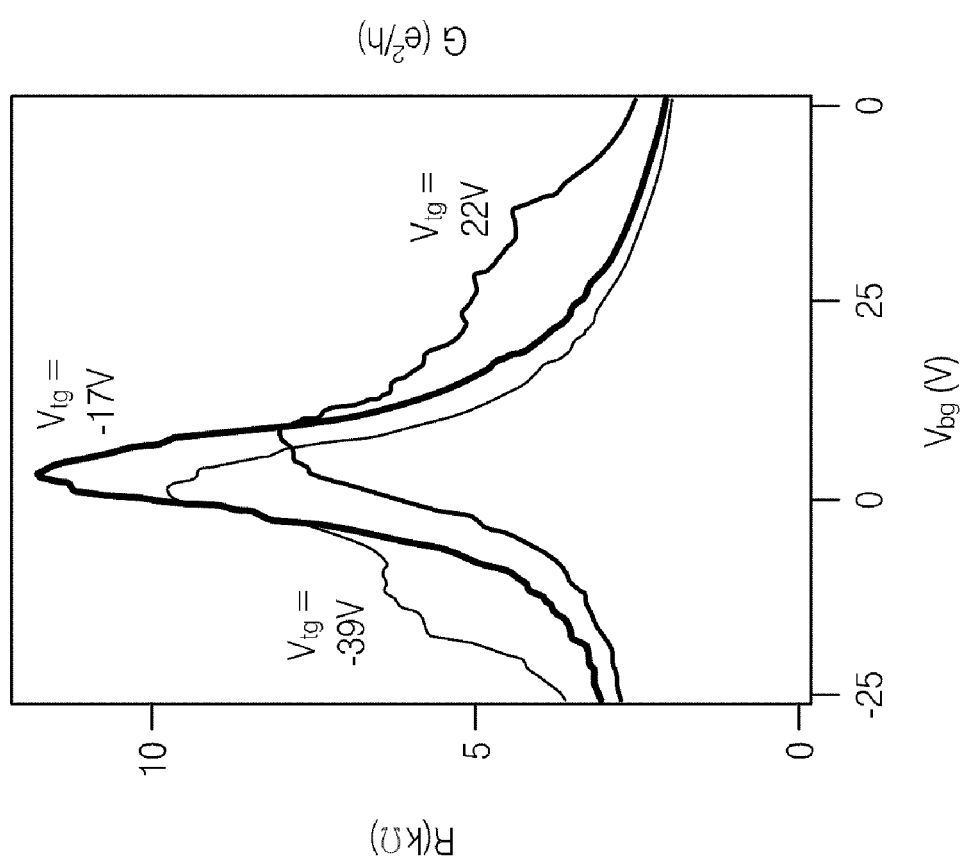
FIG. 8B is a plot of differential resistance for an embodiment of a graphene device employing a suspended top gate as a function of $V_{bg}$ for different $V_{tg}$.

The presence of two Dirac points is more easily seen in FIG. 8B, which plots R versus $V_{bg}$ at three fixed $V_{tg}$, corresponding to cuts along the dotted lines in FIG. 8A, about 22V, −17V, and −39V. Apart from a prominent center peak, the resistance measurement at $V_{tg}$ of about −39V exhibits an additional shoulder at about $V_{bg}$ of about −14V while the measurement at $V_{tg}$ of about 22V exhibits an additional shoulder at $V_{bg}$ of about −28V, corresponding to the Dirac point of the top-gated portion. Notably, shoulders, rather than full-blown side peaks, are observed at the second Dirac point. This occurs because the top gate controls less than about 15% of the entire device area. These results clearly indicate individual control over separate regions in the graphene device.

The slope of the white line in FIG. 8A yields the ratio of coupling efficiencies, η, of the two gates to graphene. This value is determined to be about 1.27. From simple geometry considerations, η is given by the gate-device capacitance per unit area, $C \sim \in \in_o / d$, where $\in$ is the dielectric constant of the gate dielectric, about 3.9 for $SiO_2$, $\in_o$ is the permittivity of free space, and d is the gate-device separation. Hence, the coupling ratio is given by $C_{bg}/C_{tg} = (\in_{bg}/\in_{tg})/(d_{tg}/d_{bg})$ or about (3.9)(100/300), which is about 1.3, in excellent agreement with the experimental data. Furthermore, the typical voltage range which the top gates can sustain is about 50-75 V. This value is anticipated to further increase, as the fabrication process is further optimized.

Figure 8C:
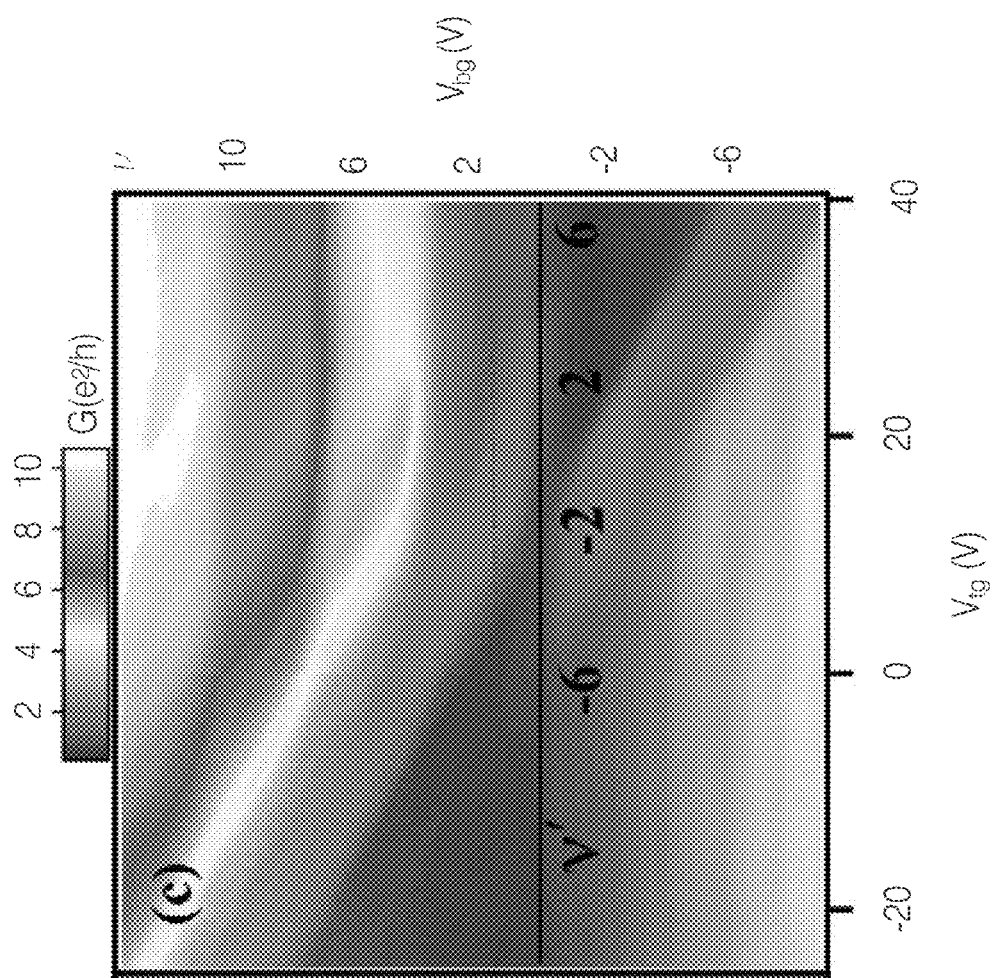
FIG. 8C is a plot of conductance at about 8T for FIG. 8B is a plot of differential resistance for an embodiment of a graphene device as a function of $V_{bg}$ and $V_{tg}$.
Figure 8D:
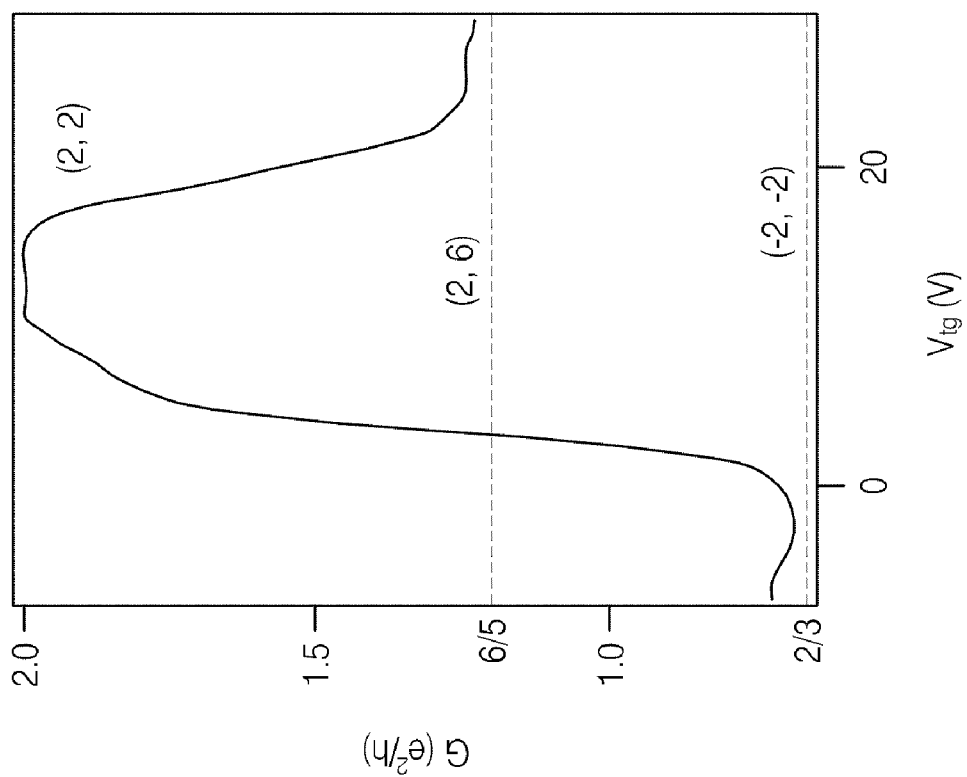
FIG. 8D is a line trace of resistance along the line indicated in FIG. 8C.

Further evidence for the formation of graphene p-n-p junctions is provided by transport data at magnetic field of about 8T. For a graphene device with a substantially uniform carrier density in high magnetic fields, the formation of quantum Hall edge states leads to a series of conductance plateaus at half-integer values of $4e_2/h$. In graphene p-n-p junctions, additional conductance plateaus are observed at fractional values, such as about ⅗ and ⅔, of $e_2/h$, as illustrated in FIGS. 8C and 8D.

Figure 8E:
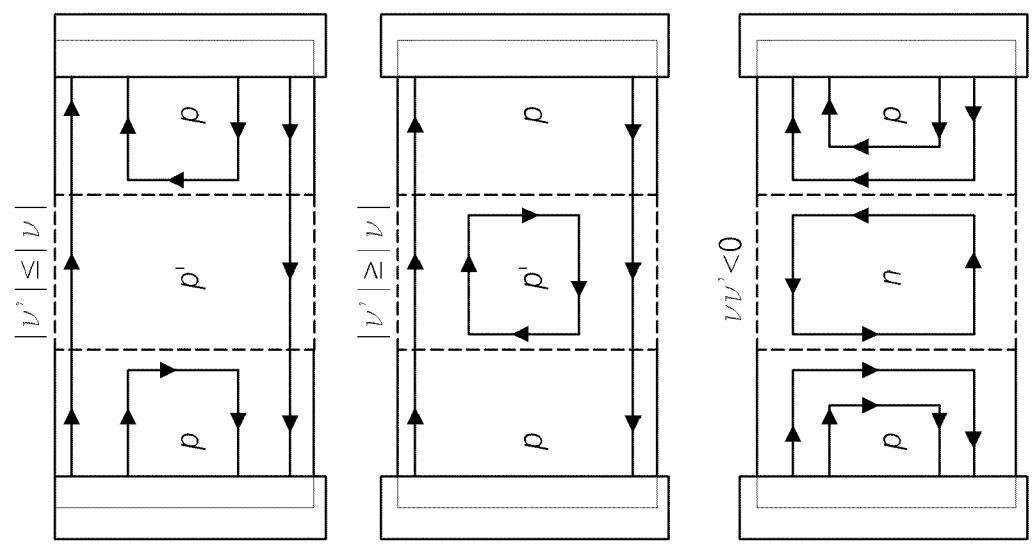
FIG. 8E is a schematic of edge state propagation for different values of v, v' in an embodiment of a graphene device employing a suspended top gate.

As shown in FIG. 8E, such fractional plateau values arise from the partial and full equilibration of the edge states at the p-n interfaces, depending on the signs and magnitudes of v and v' and the filling factors in the uncovered and top-gated regions, respectively. The values of v' (at v=0) and v are labeled at corresponding gate voltages in FIG. 8D. In particular, it is noted that the conductance plateau with the full value of $ee_2/h$ was not observed in prior investigations (e.g., B. Ozyilmaz, et al. *Phys. Rev. Lett.* 99 246801 (2007)) due to the strong effect of backscattering on the states with |v|=|v'|. In contrast, the devices investigated herein demonstrate a clear plateau at $2e_2/h$, as illustrated in FIG. 8D, establishing that transport in these p-n-p graphene devices experience relatively weak backscattering.

In summary, multi-level lithography processes for the fabrication of suspended structures have been presented. Notably, the manufacturing methods employ photolithographic processes with resists and developers, without harsher processes, such as etching of sacrificial layers or hardmasks. As a result, these manufacturing processes are ideally suited for use with systems that are chemically and/or mechanically sensitive, such as graphene. Embodiments of these manufacturing processes have been further demonstrated in the fabrication of graphene p-n-p junctions with suspended top gates. These devices exhibit high mobility and control of local doping density and type. Embodiments of this technique may be further extended to fabricate other types of suspended structures, such as local current carrying wires for inducing local magnetic fields, a point contact for local injection of current, and moving parts in microelectromechanical devices.

Although the foregoing description has shown, described, and pointed out the fundamental novel features of the present teachings, it will be understood that various omissions, substitutions, changes, and/or additions in the form of the detail of the apparatus as illustrated, as well as the uses thereof, may be made by those skilled in the art, without departing from the scope of the present teachings. Consequently, the scope of the present teachings should not be limited to the foregoing discussion, but should be defined by the appended claims.

What is claimed is:

1. A suspended structure, comprising:
   a substrate having a first surface;
   an electrically conductive structure suspended above the first surface of the substrate;
   a graphene layer positioned upon the first surface of the substrate and beneath the suspended electrically conductive structure; and
   a dielectric interposed between the electrically conductive suspended structure and the graphene layer.

2. The suspended structure of claim 1, wherein the dielectric comprises air or vacuum.

3. The suspended structure of claim 1, wherein the thickness of the graphene layer ranges between about 0.1 to 5 nm.

4. The suspended structure of claim 1, wherein the graphene comprises p-n junctions.

5. The suspended structure of claim 1, wherein the graphene comprises n-p-n junctions.

6. The suspended structure of claim 1, wherein the bridge element is positioned at a distance ranging between about 50 nm to 3 μm above the first surface of the substrate.

7. The suspended structure of claim 6, wherein the bridge element is positioned at a distance ranging between about 100 to 300 nm above the first surface of the substrate.

8. The suspended structure of claim 1, wherein the bridge element comprises one or more of semiconductors, titanium, aluminum, and alloys thereof.

9. The suspended structure of claim 8, wherein the bridge element extends a distance ranging between approximately 0.1 to 25 μm.

* * * * *